United States Patent
O'Mahony et al.

(10) Patent No.: US 9,116,204 B2
(45) Date of Patent: Aug. 25, 2015

(54) ON-DIE ALL-DIGITAL DELAY MEASUREMENT CIRCUIT

(75) Inventors: Frank O'Mahony, Portland, OR (US); Bryan K. Casper, Portland, OR (US); Mozhgan Mansuri, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 13/997,604

(22) PCT Filed: Mar. 30, 2012

(86) PCT No.: PCT/US2012/031408
§ 371 (c)(1),
(2), (4) Date: Jun. 24, 2013

(87) PCT Pub. No.: WO2013/147839
PCT Pub. Date: Oct. 3, 2013

(65) Prior Publication Data
US 2014/0203798 A1    Jul. 24, 2014

(51) Int. Cl.
*G01R 13/02*    (2006.01)
*G01R 31/317*    (2006.01)
*H03K 5/00*    (2006.01)

(52) U.S. Cl.
CPC .... *G01R 31/31725* (2013.01); *G01R 31/31726* (2013.01); *H03K 2005/00052* (2013.01)

(58) Field of Classification Search
None
See application file for complete search history.

(56) References Cited

U.S. PATENT DOCUMENTS

| | | | |
|---|---|---|---|
| 5,513,152 A | * | 4/1996 | Cabaniss ............... 368/118 |
| 6,900,676 B1 | * | 5/2005 | Tamura ................ 327/156 |
| 2003/0030071 A1 | | 2/2003 | Keim et al. |
| 2003/0184275 A1 | * | 10/2003 | Slade et al. ............. 324/66 |
| 2008/0115019 A1 | | 5/2008 | Ngo et al. |

FOREIGN PATENT DOCUMENTS

| | | |
|---|---|---|
| KR | 20-1995-0020407 A | 7/1995 |
| KR | 10-2007-0055909 A | 5/2007 |
| WO | 2013147839 A1 | 10/2013 |

OTHER PUBLICATIONS

International Search Report and Written Opinion received for Patent Application No. PCT/US2012/031408, mailed on Nov. 14, 2012, 9 pages.
Xia et al. "Sub-2-ps, Static Phase Error Calibration Technique Incorporating Measurement Uncertainty Cancellation for Multi-Gigahertz Time-Interleaved T/H Circuits." IEEE Transactions on Circuits and Systems—Regular Papers, vol. 59, No. 1, Jan. 2012, 9 pages.
Doernberg et al., "Full-speed testing of A/D converters", Solid-State Circuits, IEEE Journal of, vol. 19, No. 6, doi:10.1109/JSSC.1984.1052232, Dec. 1984, pp. 820-827.

(Continued)

*Primary Examiner* — Minh N Tang
(74) *Attorney, Agent, or Firm* — Garrett IP, LLC

(57) ABSTRACT

An all-digital delay measurement circuit (DMC) constructed on an integrated circuit (IC) die characterizes clocking circuits such as full phase rotation interpolators, also constructed on the IC die. The on-die all-digital DMC produces a digital output value proportional to the relative delay between two clocks, normalized to the clock period of the two clocks.

23 Claims, 5 Drawing Sheets

(56) References Cited

OTHER PUBLICATIONS

Lee et al., "A sub-10-ps multiphase sampling system using redundancy", Solid-State Circuits, IEEE Journal of, vol. 41, No. 1, doi:10.1109/JSSC.2005.859883, Jan. 2006, pp. 265-273. (English Abstract Only).

International Preliminary Report on Patentability and Written Opinion received for PCT Patent Application No. PCT/US2012/031408, mailed on Oct. 9, 2014, 6 pages.

* cited by examiner

ON-DIE ALL-DIGITAL DELAY MEASUREMENT CIRCUIT

BACKGROUND

Accurately measuring time delay, or skew, between two or more clocks on an integrated circuit (IC) die has many practical applications. This capability can be used to characterize and adapt phase interpolator (PI) linearity, the lock error in a phase locked loop (PLL) or delay locked loop (DLL), the phase spacing in multi-phase clock generators such as a DLL or PLL, and skew between clock domains. In communications, PI characterization or adaptation can enable accurate on-die BER eye margining. Conventional techniques used to characterize different aspects of phase delay fail to produce (1) accuracy that is independent of variation and process, voltage, and temperature (PVT), combined with (2) a digitized measurement of phase delay that can be read off-chip or used on-chip to adapt or correct for the phase delay non-ideality.

One conventional technique uses external, i.e., off-die, equipment and external measurements. For example, PI and DLL/PLL phase spacing can be characterized by bringing clock signals off-die and into external equipment to characterize delays. This approach lacks repeatability and accuracy, increases test time, and requires bulky, expensive, external equipment, all of which make the approach unsuitable for either accurate or high volume delay measurements. Another technique uses an on-die delay line as a "golden" delay reference. The accuracy of this approach is limited by PVT effects on the delay line reference, and the timing resolution of practical circuits associated with the delay line. Other techniques require voltage-offset compensated comparators and regulated reference currents, which are analog in nature and also limited by PVT effects.

BRIEF DESCRIPTION OF THE DRAWINGS/FIGURES

Figure 1:
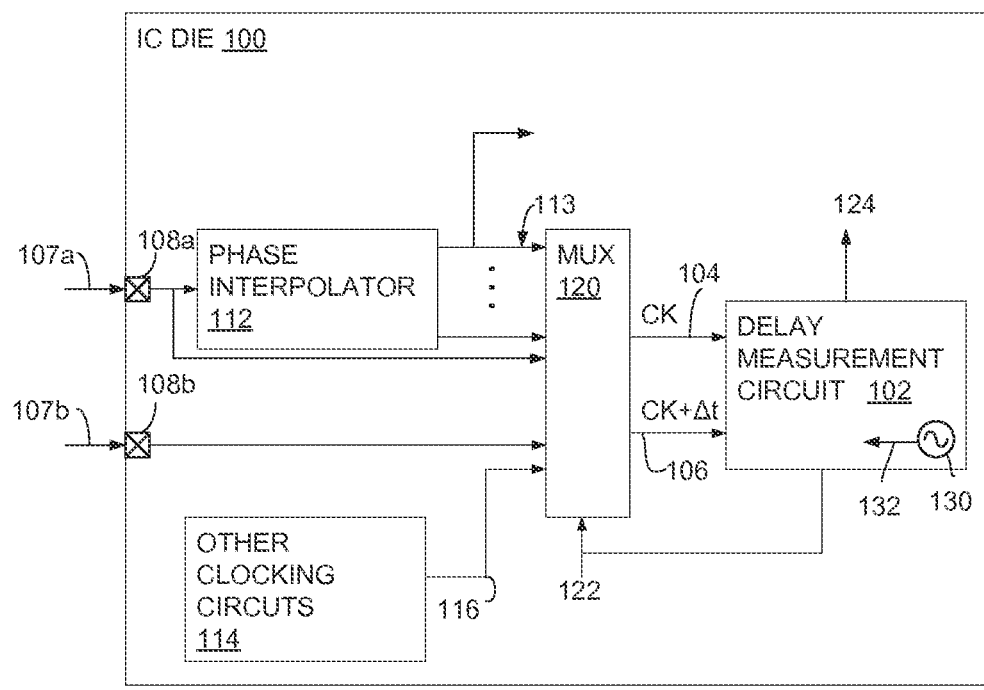
FIG. 1 is a block diagram of an example IC die on which is constructed an all-digital delay measurement circuit (DMC) for measuring a time delay between two clocks on the die.

In the drawings, the leftmost digit(s) of a reference number identifies the drawing in which the reference number first appears.

DETAILED DESCRIPTION

FIG. 1 is a block diagram of an example IC die 100 on which is constructed an all-digital delay measurement circuit (DMC) 102 for measuring a time delay between two clocks 104 CK and 106 CK+Δt on the die. Die 100 and circuits constructed thereon may receive external clocks 107a, 107b through two external die connector pads 108a, 108b. External clock 107a is provided to an on-die clocking circuit, such as a programmable PI 112 that generates multiple clocks 113 from the external clock, or alternatively, from an internal clock of the PI. Clocks 113 have programmable phase offsets, or time delays, relative to each other. Multiphase clocks 113 are used by other circuits constructed on, and/or external to, die 100. Other clocking circuits 114, such as one or more PLLs, DLLs, and/or PIs generate multiple clocks 116 that are used by other circuits on the die.

An on-die multiplexer ("mux") 120 may receive as inputs all of the clocks 107a/b, 113, and 116 and a mux select 122 from DMC 102 or another on-die controller (not shown). In response to select 122, mux 120 selects the two clocks 104, 106 from among all of the clocks 107a/b, 113, and 116 and provides the two selected clocks 104 CK and 106 CK+Δt to corresponding inputs of the DMC. For example, mux 120 may select two of the clock phases, among the multiple phases 113, generated by PI as clocks 104 and 106.

DMC 102 includes a free-running oscillator (FRO) 130 that generates a reference clock 132 having a free-running frequency, which is asynchronous to each of clocks 104, 106. Using reference clock 132, DMC 102 measures a time delay, also referred to herein as a phase delay or phase offset, between the two clocks 104, 106. DMC 102 outputs a digital measurement 124 representative of the measured time delay, or phase offset, between clocks 104 and 106. DMC 102 is an all-digital circuit, constructed on die 100, that provides an accurate, digitized measurement of the time delay between the two clocks 104, 106 that is insensitive to PVT effects. Therefore, the delay measurement is made without the need for calibration or compensation for PVT effects, and without external measurement equipment. Also, all-digital DMC 102 avoids the use of voltage-offset compensated comparators and regulated reference currents.

Figure 2:
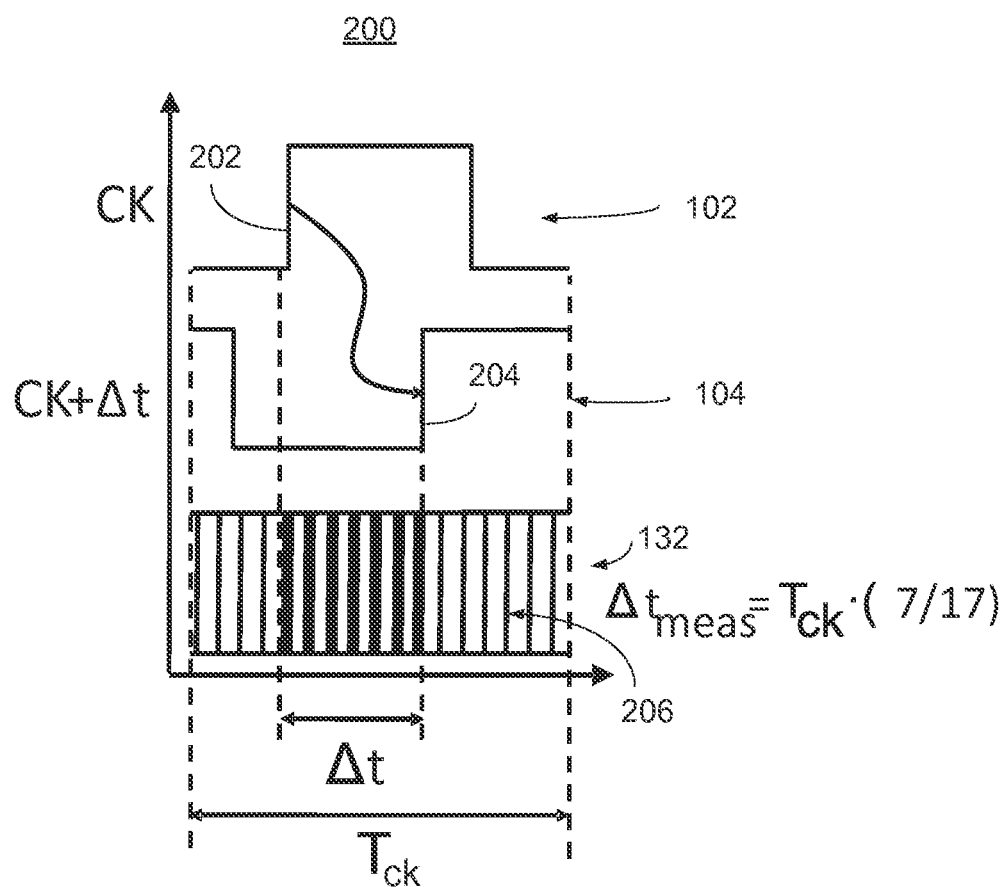
FIG. 2 is an example timing diagram useful for explaining the basic principles on which the DMC of FIG. 1 relies to measure time delay.

FIG. 2 is an example timing diagram 200 useful for explaining the basic principles on which DMC 102 relies to measure time delay. In timing diagram 200, clock CK includes a representative rising edge 202, and clock CK+Δt includes a subsequent representative rising edge 204 corresponding to CK rising edge 202. Clocks 202, 204 have the same frequency and period Tck; however, they are offset in phase from each other such that clock edge 204 lags, i.e., is subsequent to, clock edge 202 in time/phase by Δt. Timing diagram 200 is essentially an oscilloscope view synchronized to clocks CK and CK+Δt that overlays many traces captured over an extended measurement period. At the bottom of timing diagram 200, over time, asynchronous, free-running reference clock 132 generates a uniform density of clock edges relative to synchronized clocks 104, 106 being measured. The timing diagram for reference clock 132 at the bottom of diagram 200 represents an accumulation of overlays of asynchronous reference clock 132 over the extended measurement period, each vertical line 206 being either a rising, or a falling, edge of clock 132 that was captured on one of the overlays. Over time, the asynchronous edges 206 of reference clock 132 walk through, or across, period Tck of clocks 104, 106. The period of reference clock 132 should be equal to or greater than twice the maximum expected value of Δt.

Under the above conditions, time/phase delay Δt between corresponding clock edges 202, 204, also referred to herein as the time delay or phase offset between clocks 102 and 104, can be expressed as being proportional to the sum over time of all of the reference clock edges that fall between the two corresponding edges of clocks CK and CK+Δt 202, 204 (i.e., edge 202 and subsequent edge 204) during the measurement period divided by the total sum of the reference clock edges 206 that occurred during the measurement period. Mathematically, during the measurement period:

$\Delta t = Tck \cdot \Sigma(\text{the reference clock edges occurring between } CK \text{ and } CK+\Delta t)/\Sigma(\text{All of the reference clock edges})$ For example, in FIG. 2, the total number of reference clock edges 206 accumulated over the measurement period is 17 and the number that occurred between subsequent rising clock edges of clocks CK and CK+Δt is 7. Therefore, the measured delay is proportional to (7/17). The accuracy of the measured delay is a function of the uniformity of the reference clock edge distribution relative to the clocks being measured, i.e., clocks CK and CK+Δt. The accuracy improves as the measurement period is increased, or equivalently, as the number of reference clock edges increases. As depicted in FIG. 2, a number of reference clock edges between clock edge 202 and a first subsequent clock edge 204 is used to determine the time delay Δt. However, a number of reference clock edges between clock edge 202 and a second, third, fourth, etc., edge of clock CK+Δt may be used instead, as long as the DMC is configured to compare the desired edges.

Figure 3:
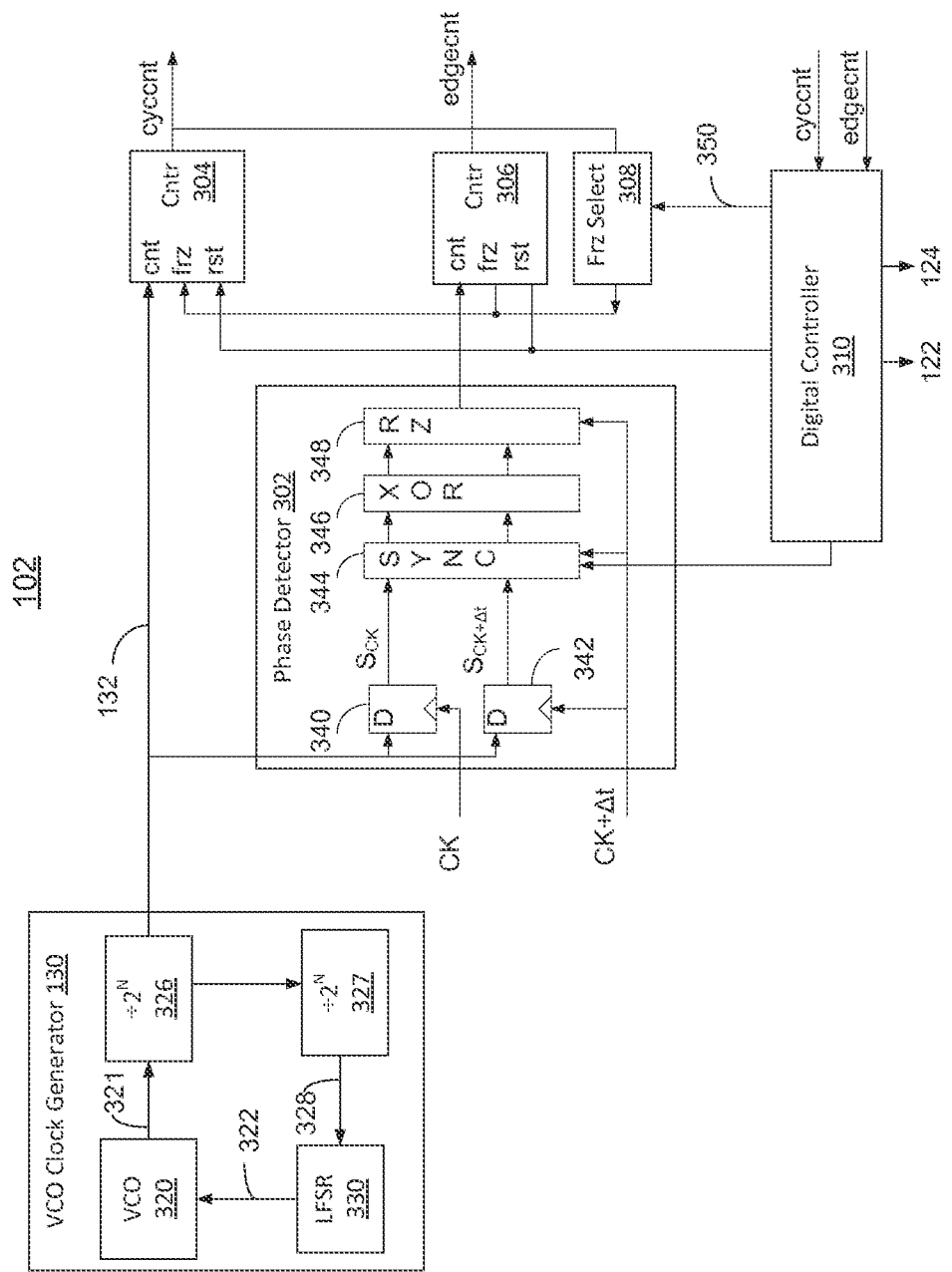
FIG. 3 is a block diagram of the DMC according to an embodiment.

FIG. 3 is a block diagram of DMC 102 according to an embodiment. DMC 102 includes: FRO 130 to generate reference clock 132, which is asynchronous to clocks CK and CK+Δt; an all-digital phase detector 302 that receives reference clock 132, and clocks CK and CK+Δt to be measured, and repeatedly detects if a reference clock edge occurs between corresponding edges of clocks CK and CK+Δt during a measurement period; a counter circuit including counters 304, 306, where counter 304 counts a total number of reference clock edges that occur in a predetermined measurement period, and counter 306 counts the number of reference clock edges that occurred between the edges of clocks CK and CK+Δt, i.e., that were detected by the phase detector during the measurement period; a freeze selector 308, connected to the counters, that terminates the measurement period; and a digital controller 310, to control the aforementioned circuits of the DMC, and report time delay measurement 124 to circuits external to DMC 102.

FRO 130 includes the following exemplary circuits configured in a loop: a digitally controlled oscillator (DCO) 320 that generates a clock 321 having a frequency modulated responsive to an input code word 322, a divider 326 that divides the frequency of clock 321 to produce reference clock 132, a second divider 327 that further divides the frequency of clock 321 to produce a divided clock 328, a digital linear feedback shift register (LFSR) 330 that scrambles code word 322 responsive to clock 328 so as to randomly modulate the DCO frequency, and thus spread the frequency of free-running reference clock 132. As a result, FRO frequency 132 is a spread spectrum frequency, which enhances time delay measurement accuracy, as discussed above in connection with FIG. 2.

Phase detector 302 includes the following circuits that sequentially process samples of reference clock 132 in accordance with clocks CK and CK+Δt: digital latches, which may include sampling flip-flops (FFs) 340, 342; a synchronizer 344; a bit comparator 346, which may be an XOR circuit; and a return-to-zero circuit 348. FFs 340, 342 sample reference clock 132 with clocks CK, CK+Δt applied to the clock input of the FFs to produce reference clock samples Sck and Sck+Δt, respectively. Reference clock samples Sck and Sck+Δt are spaced in time by Δt, which is the time difference to be measured by DMC 102. Synchronizer 344 time aligns the reference clock samples Sck and Sck+Δt so that they can be compared against each other by XOR 346.

If reference clock samples Sck and Sck+Δt are at different logic states/levels, i.e., logic "1" and logic "0", or vice versa, that condition indicates that an edge of reference clock 132 occurred between corresponding edges of clocks CK and CK+Δt (e.g., a rising edge of clock CK and a subsequent rising edge of clock CK+Δt, and this occurrence needs to be counted. Otherwise, a reference clock edge did not occur between the corresponding edges of clocks CK and CK+Δt. Accordingly, XOR 346 generates a logic "1" only when reference clock samples Sck and Sck+Δt are at different logic states, indicating that the reference clock edge occurred. XOR 346 supplies its result output to return-to-zero (RZ) circuit 348. Each time XOR 348 generates a logic "1" indicating a reference edge occurred, RZ circuit 348 generates a short pulse that increments counter 306. Over a continuous, extended measurement period of many reference clock cycles, phase detector 302 will detect multiple reference clock edge occurrences of asynchronous reference clock 132, and counter 306 accumulates these occurrences during that measurement period.

More generally, digital phase detector 302 receives reference clock 132, the first clock CK, and the second clock CK+Δt, and repetitively detects over the measurement period an edge event of the reference clock in relation to the first clock and the second clock, e.g., if a reference clock edge occurred between an edge of the first clock and a subsequent edge of the second clock.

a counter circuit to count during the measurement period a number of the detected reference clock edge events, wherein the number of events is proportional to a time delay between the first and second clock.

Controller 310 and freeze select 308 cooperate to control counters 304, 306, and determine the measurement period used to measure the time delay between clocks CK and CK+Δt. Counters 304 and 306 respectively generate count values cyccnt (the total number of reference clock edges) and edgecnt (the number of reference clock edges that occurred between corresponding edges of clocks CK and CK+Δt). Controller 310 receives both cyccnt and edgecnt, while freeze selector 308 also receives cyccnt. Controller 310 provides a stop count word 350 to freeze selector 308 and may also reset counters 304, 306. The freeze selector freezes both counters when cyccnt matches the stop count word.

DMC 102 operates as follows to set a measurement period and determine a time delay between clocks CK and CK+Δt. Initially, controller 310 resets counters 304, 306 to zero, and loads the stop count word 350 into freeze selector 308, which then unfreezes the counters. The stop count word 350 determines the measurement period. Then, counter 304 begins to count total reference clock edges and counter 306 begins to count occurrences of reference clock edges falling between CK and CK+Δt responsive to pulses output by return-to-zero circuit 348. When cyccnt matches the stop word count 350, indicating an end to the measurement period, freeze selector 308 freezes counters 304, 306, which in turn freezes cyccnt and edgecnt. Then, controller 310 reads cyccnt (N) and edgecnt (R), and determines the time delay Δt based on the ratio of the counts, as described above. Controller 310 outputs the measurement as a digital word 124. The time delay measured $\Delta t_{meas}$ is given by the following:

$$\Delta t_{meas} = T_{ck} \cdot R_{edges}/(2 \cdot N_{totaledges})$$

The factor of 2 in the denominator reflects that counter 306 counts both rising and falling edges of pulses output by R-Z circuit 348. In other embodiments, counter 306 may count only rising edges, and R-Z circuit 348 may be omitted.

More generally, digital phase detector 302 receives reference clock 132, the first clock CK, and the second clock CK+Δt, and repetitively detects over the measurement period an edge event of the reference clock in relation to the first clock and the second clock, e.g., if a reference clock edge occurred between an edge of the first clock and a subsequent edge of the second clock. During the measurement period, the counter 306 counts the number of detected reference clock events (e.g., the number of reference clock edges that occurred between corresponding edges of clocks CK and CK+Δt), which number is proportional to the time delay between the first and second clocks. During the measurement period, counter 304 counts the total number of reference clock edges that occurred during the measurement period. The ratio of the detected reference clock events to the total number of reference clock edges is proportional to the time delay between the first and second clocks. Controller 310 may output the ratio, a scaled version of the ratio, or simply the number of detected reference clock events, each of which is proportional to, and thus representative of, the time delay.

Figure 4:
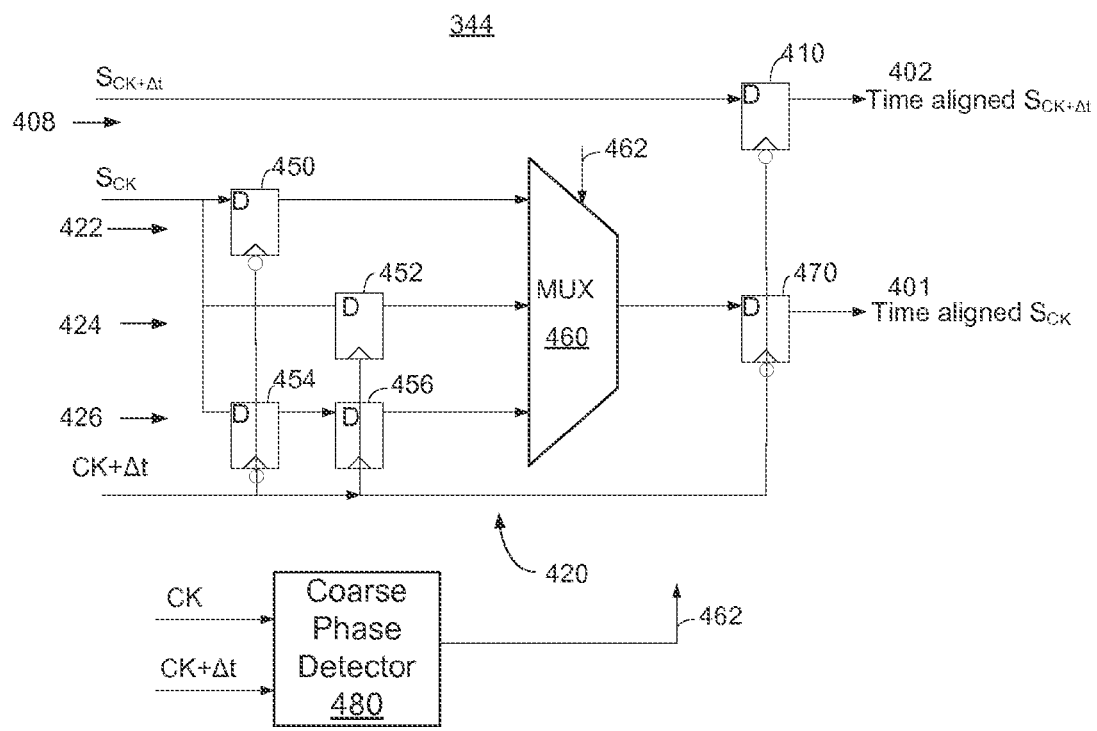
FIG. 4 is a circuit diagram of an example synchronizer of the DMC that produces time aligned versions of offset reference clock samples.

FIG. 4 is a circuit diagram of an example circuit for synchronizer 344 that produces time aligned versions 401, 402 of reference clock samples Sck (401) and Sck+Δt (402), according to an embodiment. Synchronizer 344 includes a first path 408 for routing reference clock sample Sck+Δt, without delay. A FF 410 clocked on falling edges of clock CK+Δt holds reference clock sample Sck+Δt for comparison by XOR 346. Synchronizer 344 includes a digitally programmable delay circuit 420 through which reference clock sample Sck is routed in parallel with reference clock sample Sck+Δt. Delay circuit 420 retimes reference clock sample Sck by clocking it through flip-flops using selected ones of either rising or falling edges of clock CK+Δt, which thereby moves reference clock sample Sck into the time domain of reference clock sample Sck+Δt for comparison. Delay circuit 420 includes multiple, parallel coarse delay paths 422, 424, 426 for reference clock sample Sck, each of which delays the reference clock sample Sck by an additional one half-clock cycle of the clock CK+Δt relative to the previous path, i.e., delay path 422 adds a one half-clock delay, path 424 adds a two half-clock delay, and path 426 adds a 3 half-clock cycle delay. As depicted, each of the delay paths 422, 424, and 426 includes one or more of FFs 450, 452, 454, and 456 each clocked with either falling or rising edges of clock CK+Δt, as appropriate, to introduce the appropriate half-cycle delay for the delay paths, as would be understood by one of skill in the relevant art after having read the description herein. A mux 460 selects one of the delay paths 422, 424, and 426, and hence the corresponding delay, as its output according to a mux select 462 from a coarse phase detector 480 of synchronizer 344 (described below) and controller 310, and provides the thus selected, delayed version of reference clock sample Sck to a holding FF 470 (in parallel with FF 410), where the delayed or retimed version is held in parallel with the held version of reference clock sample Sck+Δt, ready for comparison by XOR circuit 346.

Synchronizer 344 also includes coarse phase detector 480 to automatically select which of delay paths 422, 424, and 426 will be selected by mux 460 to provide the retimed reference clock sample Sck to FF 470 for comparison. Coarse phase detector 480 includes flip-flops configured as a binary phase detector that receive clocks CK and CK+Δt and automatically determine from those clocks where the edges of clock CK are positioned within the full period of clock CK+Δt, i.e., within a first portion or a second portion of the clock period, and then select the appropriate one of delay paths 422, 424, and 426 based on this determination. The appropriate delay path is selected to avoid timing and set-up and hold violations. For example, if the rising edges of clock CK occurs too near the rising edges of clock CK+Δt, then half-cycle delay path 422 is selected, i.e., reference clock sample Sck is retimed on a falling edge of clock CK+Δt. If the rising edge of clock CK is too near the falling edge of clock CK+Δt, then the one cycle delay path is selected, and so on.

Methods and systems disclosed herein may be implemented with respect to one or more of a variety of systems such as described below with reference to FIG. 5. Methods and systems disclosed herein are not, however, limited to the example of FIG. 5.

Figure 5:
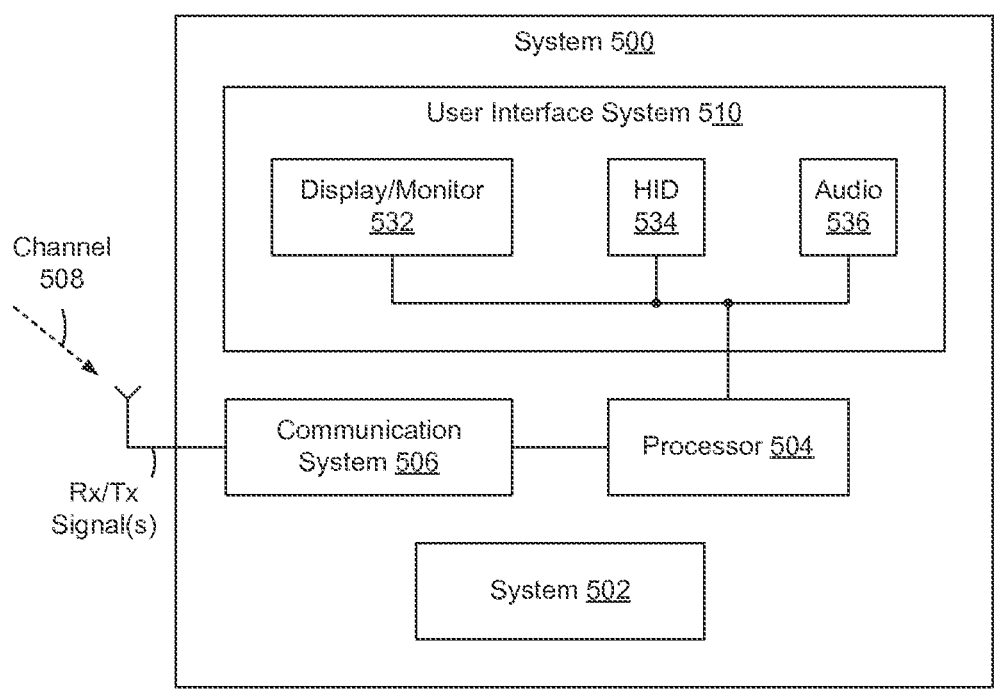
FIG. 5 is a block diagram of an example system including an on-die DMC to provide on-die time delay measurement between phase-offset clocks.

FIG. 5 is a block diagram of an example system 500 including a system 502 to measure a time delay between two clocks generated within system 500. System 502 may include a delay measurement circuit (DMC), a PI, and other clock generator circuits, all constructed on an IC die, as described in one or more examples herein.

System 500 may further include one or more of a processor 504, a communication system 506, and a user interface system 510.

Communication system 506 may be implemented to interface between a communication network and processor 504 and/or user interface system 510. Communication system 506 may include a wired and/or wireless communication system.

Processor 504 may be implemented to interface with communication system 506 and/or user interface system 510.

System 500 or portions thereof may be implemented within one or more integrated circuit dies, and may be implemented as a system-on-a-chip (SoC).

User interface system 510 may include a monitor or display 532 to display information from processor 504.

User interface system 510 may include a human interface device (HID) 534 to provide user input to processor 504. HID 534 may include, for example and without limitation, one or more of a key board, a cursor device, a touch-sensitive device, and or a motion and/or image sensor. HID 534 may include a physical device and/or a virtual device, such as a monitor-displayed or virtual keyboard.

User interface system 510 may include an audio system 536 to receive and/or output audible sound.

System 500 may correspond to, for example, a computer system, a personal communication device, and/or a television set-top box.

System 500 may include a housing, and one or more of system 502, processor 504, communication system 506, and user interface system 510, or portions thereof may be positioned within the housing. The housing may include, without limitation, a rack-mountable housing, a desk-top housing, a lap-top housing, a notebook housing, a net-book housing, a set-top box housing, a portable housing, and/or other conventional electronic housing and/or future-developed housing.

Apparatus, system, and method embodiments for measuring time delay have been described herein. An apparatus embodiment comprises a free-running oscillator to generate a reference clock, a digital phase detector to receive a first clock and a second clock and repetitively detect over a measurement period if an edge transition of the reference clock occurred between a first edge of the first clock and a subsequent second edge of the second clock, and a counter circuit to count during the measurement period a number of reference clock edges detected by the phase detector, and a total number of edges of the reference clock that occurred, wherein the free-running oscillator, the digital phase detector, and the counter circuit are all constructed on an integrated circuit (IC) die.

In the embodiment, a time delay between the first edge and the second edge is proportional to a ratio of the number of reference clock edges detected to the total number of edges of the reference clock that occurred.

In the embodiment, a digital controller, constructed on the IC die, controls the digital phase detector and the counter circuit, and outputs a digital word representative of the measured time delay.

The embodiment further comprises clocking circuits, constructed on the IC die, that generate the first and second clocks.

In the embodiment, the free-running oscillator includes a digitally controlled oscillator (DCO) that is frequency modulated to spread a frequency of the reference clock.

Another apparatus embodiment comprises a digital delay measurement circuit to generate a digital value representative of a time delay between the clocks.

In this embodiment, the delay measurement circuit is implemented to generate the digital value proportional to a relative delay between first and second clocks, normalized to the clock period of the two clocks.

The delay measurement circuit is implemented on an integrated circuit (IC) die to characterize clock circuits of the IC die.

The delay measurement circuit includes, a digital phase detector to detect edges of a reference clock in relation to first and second clocks during a measurement period, and a counter circuit to count detected edges during the measurement period, wherein the delay measurement circuit is implemented to determine the delay between the first and second clocks based on the count.

The digital phase detector is implemented to detect an edge of the reference clock when it occurs between an edge of the first clock and a subsequent edge of the second clock.

The counter circuit is implemented to count the detected edges of the reference clock and the edges of the reference clock during the measurement period.

The delay measurement circuit is further implemented to determine the delay between the first and second clocks based on a ratio of a number of detected edges to a number of reference clock edges counted during the measurement period.

The delay measurement circuit further includes, a digital controller to control the digital phase detector and the counter circuit, and to output a digital word representative of the time delay.

Methods and systems disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, and/or a combination of integrated circuit packages. Software may include a computer readable medium encoded with a computer program including instructions to cause a processor to perform one or more functions in response thereto. The computer readable medium may include a transitory and/or non-transitory medium. The processor may include a general purpose instruction processor, a controller, a microcontroller, and/or other instruction-based processor.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. An apparatus, comprising:
    a digital phase detector to detect edges of a reference clock in relation to first and second clocks during a measurement period;
    a counter to count detected edges of the reference clock during the measurement period; and
    controller to generate a digital value representative of a time delay between the first and second clocks based on the count.

2. The apparatus of claim 1, wherein the controller is configured to generate the digital value proportional to a relative delay between the first and second clocks, normalized to a clock period of the first and second clocks.

3. The apparatus of claim 1, wherein the digital phase detector, the counter, and the controller are implemented on an integrated circuit (IC) die and configured to characterize clock circuits of the IC die.

4. The apparatus of claim 1, wherein the digital phase detector is configured to detect an edge of the reference clock that occurs between an edge of the first clock and a subsequent edge of the second clock.

5. The apparatus of claim 1, wherein:
    the digital phase detector is configured to detect edges of the reference clock that occur between edges of the first and second clocks;
    the counter is configured to maintain a first count of detected edges of the reference clock that occur between edges of the first and second clocks, and a second count of edges of the reference clock that occur during the measurement period; and
    the controller is configured to determine the delay between the first and second clocks based on a ratio of the first and second counts.

6. The apparatus of claim 1, wherein the controller is configured to control the digital phase detector and the counter, and to generate the digital value as a digital word representative of the time delay.

7. The apparatus of claim 1, wherein the digital phase detector includes:
    a first digital latch to sample the reference clock based on edges of the first clock to generate first reference clock samples;
    a second digital latch to sample the reference clock based on edges of the second clock to generate second reference clock samples;
    a synchronizer to time-align the first reference clock samples with corresponding second reference clock samples; and
    a bit comparator to compare respective time-aligned first and second reference clock samples.

8. The apparatus of claim 7, wherein the synchronizer includes:
    a programmable delay path to route the first reference clock samples from the first digital latch to the bit comparator with a selectable time delay.

9. The apparatus of claim 8, wherein the selectable time delay is a function of the second clock.

10. The apparatus of claim 9, wherein the programmable delay path includes multiple delay paths, each including one or more digital latches to latch the first reference clock samples based on the second clock as a latching clock, to provide the selectable time delay as an integer multiple of a period of the second clock.

11. The apparatus of claim 10, wherein the synchronizer further includes:
a coarse phase detector to compare a timing of the first clock relative to the second clock and to select one of the multiple delay paths based on the comparison.

12. The apparatus of claim 1, wherein the delay measurement circuit further includes a free-running oscillator to generate the reference clock.

13. The apparatus of claim 12, wherein the free-running oscillator includes a frequency modulated digitally controlled oscillator (DCO) to spread a frequency of the reference clock.

14. A system, comprising:
a processor;
a user interface system to interface with the processor;
a communication system to communicate between a network and one or more of the processor and the user interface system; and
an integrated circuit (IC) die that includes digital delay measurement circuitry and at least a portion of one or more of the processor, the user interface system, and the communication system;
wherein the digital delay measurement circuitry includes,
a digital phase detector to detect edges of a reference clock in relation to first and second clocks during a measurement period;
a counter to count detected edges of the reference clock during the measurement period; and
a controller to generate a digital output value proportional to a time delay between first and second clocks generated within the integrated circuit die.

15. The system of claim 14, further including a housing, wherein the processor and the communication system are positioned within the housing.

16. The system of claim 15, wherein:
the communication system includes a wireless communication system; and
the processor, the communication system, and at least a portion of the user interface system are positioned within the housing.

17. The system of claim 14, wherein the controller is configured to generate the digital value proportional to a relative delay between the first and second clocks, normalized to a clock period of the first and second clocks.

18. The system of claim 14, wherein the digital phase detector, the counter, and the controller are configured to characterize clock circuits of the IC die.

19. The system of claim 14, wherein the digital phase detector is configured to detect an edge of the reference clock that occurs between an edge of the first clock and a subsequent edge of the second clock.

20. The system of claim 14, wherein:
the digital phase detector is configured to detect edges of the reference clock that occur between edges of the first and second clocks;
the counter is configured to maintain a first count of detected edges of the reference clock that occur between edges of the first and second clocks, and a second count of edges of the reference clock that occur during the measurement period; and
the controller is configured to determine the delay between the first and second clocks based on a ratio of the first and second counts.

21. The system of claim 14, wherein the controller is configured to control the digital phase detector and the counter, and to generate the digital value as a digital word representative of the time delay.

22. The system of claim 14, wherein the digital phase detector includes:
a first digital latch to sample the reference clock based on edges of the first clock to generate first reference clock samples;
a second digital latch to sample the reference clock based on edges of the second clock to generate second reference clock samples;
a synchronizer to time-align the first reference clock samples with corresponding second reference clock samples; and
a bit comparator to compare the respective time-aligned first and second reference clock samples.

23. The system of claim 22, wherein the synchronizer includes:
a programmable delay path to route the first reference clock samples from the first digital latch to the bit comparator with a selectable time delay.

* * * * *